United States Patent [19]

Suter

[11] Patent Number: 5,214,795

[45] Date of Patent: May 25, 1993

[54] LOW VOLTAGE AUTOMATIC FREQUENCY CONTROL SWITCH FOR A RADIO RECEIVER

[75] Inventor: Richard R. Suter, Beaverton, Oreg.

[73] Assignees: Seiko Corp.; Seiko Epson Corp., both of Japan

[21] Appl. No.: 373,369

[22] Filed: Jun. 29, 1989

[51] Int. Cl.⁵ .......................... H04B 1/18; G05F 1/40
[52] U.S. Cl. .............................. 455/182.2; 455/192.2; 455/344; 323/281; 323/316
[58] Field of Search ................ 455/344, 234, 182, 192; 323/281, 284, 313, 315–316

[56] References Cited

U.S. PATENT DOCUMENTS

| | | | |
|---|---|---|---|
| 4,731,574 | 3/1988 | Melbert | 323/281 |
| 4,758,773 | 7/1988 | Fushimi et al. | 323/284 |
| 4,857,862 | 8/1989 | Brokaw | 323/281 |
| 4,885,802 | 12/1989 | Ragan | 455/344 |

*Primary Examiner*—Reinhard J. Eisenzopf
*Assistant Examiner*—Andrew Faile
*Attorney, Agent, or Firm*—Elmer Galbi

[57] ABSTRACT

An AFC switch circuit is controlled by an select input logic signal for providing a selected output signal to control the local oscillator in a miniature FM receiver. The output signal has a voltage equal to either an AFC signal voltage for AFC operation of the receiver, or a reference voltage for synthesized operation of the receiver. The AFC switch circuitry employs bipolar transistors in current mirror configurations to minimize voltage offset and to enhance isolation between the unselected input and the output while operating on a power supply voltage less than 3 volts.

4 Claims, 3 Drawing Sheets

LOW VOLTAGE AUTOMATIC FREQUENCY CONTROL SWITCH FOR A RADIO RECEIVER

BACKGROUND OF THE INVENTION

This invention relates to miniature portable FM receivers, for example, for one-way paging systems and, more particularly, to circuits and methods for switching such receivers between a synthesized or phase-locked loop (PLL) mode and an automatic frequency control (AFC) mode of controlling the frequency of the local oscillator.

Commonly-assigned application No. 213,719 filed Jun. 30, 1988, now U.S. Pat. No. 4,885,802 entitled "Wristwatch Receiver Architecture," which is now U.S. Pat. No. 4,885,802 issued Dec. 5, 1989 is incorporated herein by reference. That application discloses a miniature portable FM receiver arranged for one-way paging applications. In such a receiver, the local oscillator may be operated in either a PLL synthesized mode or in an AFC mode. In the synthesized mode, a constant reference voltage is provided to one of the two control inputs of a local oscillator (LO). In the AFC mode, the synthesizer is disabled, and an AFC voltage is provided instead to the LO.

Commonly-assigned application Ser. No. 213,719 filed Jun. 30, 1988, which has been issued as U.S. Pat. No. 4,885,802, discloses the concept of shutting off the frequency synthesizer when the FM receiver is receiving data to conserve power and prevent noise from the synthesizer from interfering with or degrading the data. When the synthesizer is disabled, the LO must be switched from synthesizer to AFC mode.

In a system where the circuit shown in the previously referenced patent application is implemented using low voltage circuitry which operates in a differential mode, the design of a switch circuit for LO mode switching presents several technical challenges. Known analog switches such as the National Semiconductor LF13508 analog multiplexer require a relative high supply voltage, and such circuits only have single input terminals. Other known differential analog multiplexers, for example, the National Semiconductor LF13509, provide differential inputs and outputs, whereas the LO signal which is being switched in the present application requires that the AFC switch have a single ended output.

Another requirement is that AFC switch circuitry have low offset. Because of very high gain in the LO, an offset error in the control voltage may force the LO so far off the desired frequency in AFC mode that the feedback system derails. In that event, the receiver would be useless until the synthesizer restarts.

Yet another requirement is high isolation from input to output; that is, when one input is selected, there must be high isolation from the unselected input to the output.

SUMMARY OF THE INVENTION

Accordingly, it is an object of the present invention to select among differential and single-ended input signal voltages for controlling a local oscillator in a miniature FM receiver.

Another object of the invention is to provide for switching between synthesized and AFC modes of FM receiver operation in a very low power supply voltage environment.

A further object is to minimize offset between an AFC feedback signal voltage and a reference voltage which also can be connected to the local oscillator.

The invention provides methods and apparatus for switching an FM receiver between two modes of operation. More specifically, it includes methods and apparatus for providing an appropriate control signal to the local oscillator during both a synthesized mode of operation and an AFC mode of operation, and for providing a smooth transition between these two modes.

The invention provides an integrated low voltage AFC switch circuit for use in a miniature FM receiver. The AFC switch circuit includes input terminals for receiving a differential detector input signal from the detector. An amplifier is coupled to the differential input terminals for converting the input signals to an AFC signal having a voltage related to the differential detector input signal voltage. The AFC signal includes a DC component and modulated components. The signal is the difference between the two differential input signal voltages.

The switch circuit also includes input terminals for receiving a reference signal having a predetermined reference voltage and for receiving a select input logic signal. Switch circuitry, responsive to the select input logic signal, provides an output signal having a voltage equal to either the AFC signal voltage or the reference voltage.

The switch circuitry preferably includes a select amplifier, coupled to the select input terminal and responsive to such a select input logic signal, for providing either an AFC enable current or a reference enable current. An AFC current mirror is coupled to the select amplifier to provide an AFC mirror current equal to the AFC enable current. Similarly, a reference current mirror is coupled to the select amplifier to provide a reference mirror current equal to the reference enable current.

A first amplifier, enabled by the AFC mirror current and coupled to the detector amplifier, provides an output voltage equal to the AFC signal voltage to the output terminal when the AFC mirror current is flowing or ON. Similarly, a second amplifier, enabled by the reference mirror current and coupled to the reference voltage source, provides an output voltage equal to the reference signal voltage to the output terminal when the reference mirror current is ON.

The select amplifier preferably includes a pair of bipolar transistors each having an emitter terminal coupled to a common emitter current source. A base current source provides base drive current to one of the transistors. A diode is coupled between the base current source and the select input terminal for shunting the base current toward the input terminal (and away from the first one of the transistors) when the select input logic signal is in a logical LOW state. The first transistor base terminal is coupled to the base current source and arranged such that the base current drives the first transistor ON so long as the select input logic signal is in a logical HIGH state. The second transistor base terminal is coupled to a band gap voltage source.

The reference enable current thus is the collector current in the first transistor and the AFC enable current is the collector current of the other one of the pair of transistors. The switch circuitry is operable with a total nominal supply voltage of 2.7 volts.

Another aspect of the invention is a method of switching a miniature FM receiver having a local oscillator and a detector among a synthesizer mode of operation and an AFC mode of operation. The method includes the steps of generating a differential input signal in the detector; converting the differential input signal to an AFC signal having a voltage related to the differential detector input signal voltages; providing a reference signal having a predetermined reference voltage; selecting one of the reference voltage and the AFC signal voltage; and providing an output signal having a voltage equal to the selected voltage to the local oscillator for controlling the local oscillator.

In the disclosed method, the actual detector signal and reference signal are not directly coupled to the local oscillator. Rather, the steps of selecting and providing an output signal include: providing an AFC amplifier and a reference amplifier, each amplifier having an input node and an output node; coupling the reference signal to the reference amplifier input node; coupling the AFC signal to the AFC amplifier input node; and selecting either an AFC enable current corresponding to selecting the AFC signal or a reference enable current corresponding to selecting the reference signal.

The AFC enable current is mirrored as an input stage bias current coupled to enable the AFC amplifier. Similarly, the reference enable current is mirrored as an input stage bias current coupled to enable the reference amplifier. The outputs of the AFC amplifier and the reference amplifier are coupled to an output terminal. Finally, the output terminal is coupled back to the reference amplifier inverting input and to the AFC amplifier inverting input for providing unity gain operation to the selected input signal and high isolation to the unselected input signal.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
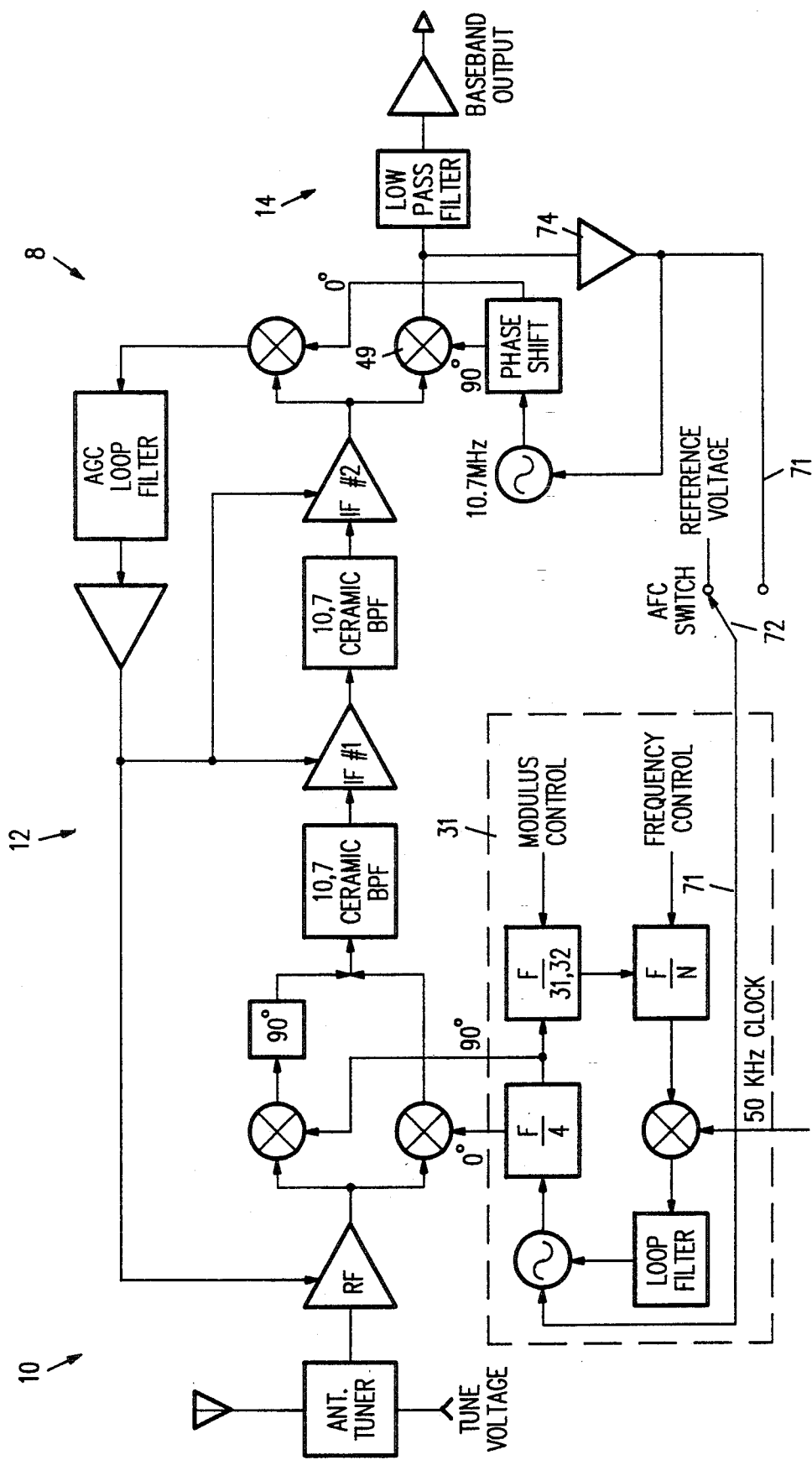
FIG. 1 is a block diagram of a wristwatch FM receiver that includes an AFC switch circuit according to the present invention.

FIG. 1 is a block diagram of an FM receiver that incorporates an AFC switch (72) in accordance with the present invention. The organization and operation of the receiver shown in FIG. 1 is disclosed in detail in commonly-assigned Ser. No. 213,719 referenced above. Briefly, the receiver 8 includes an RF stage 10, an IF stage 12 and a base band stage 14. A synchronous detector includes a mixer 49 injected with a 10.7 Mhz signal. In the embodiment of the circuit shown herein the synchronous detector provides a differential detector input signal along path 51 through amplifier 74 to AFC switch 72. Amplifier 74 converts the signal to a single-ended signal. The other input to AFC switch 72 is a reference voltage. Additionally, AFC switch 72 has a select input. The select input receives a binary select signal. The voltage selected by the AFC switch in accordance with the select input is provided to the local oscillator 31.

In a synthesized mode of operation, the AFC switch provides a constant reference voltage to the LO in the synthesizer circuitry 31. In the AFC mode of operation, the detector differential input signals from 51 are converted to a single voltage signal by amplifier 74 which, in turn, is input to the voltage controlled oscillator in synthesizer circuitry 31 through AFC switch 72.

The AFC switch 72 is controlled by select circuitry (not shown). The select circuitry provides a binary logic signal for selecting either the synthesized mode or the AFC mode.

Figure 2:
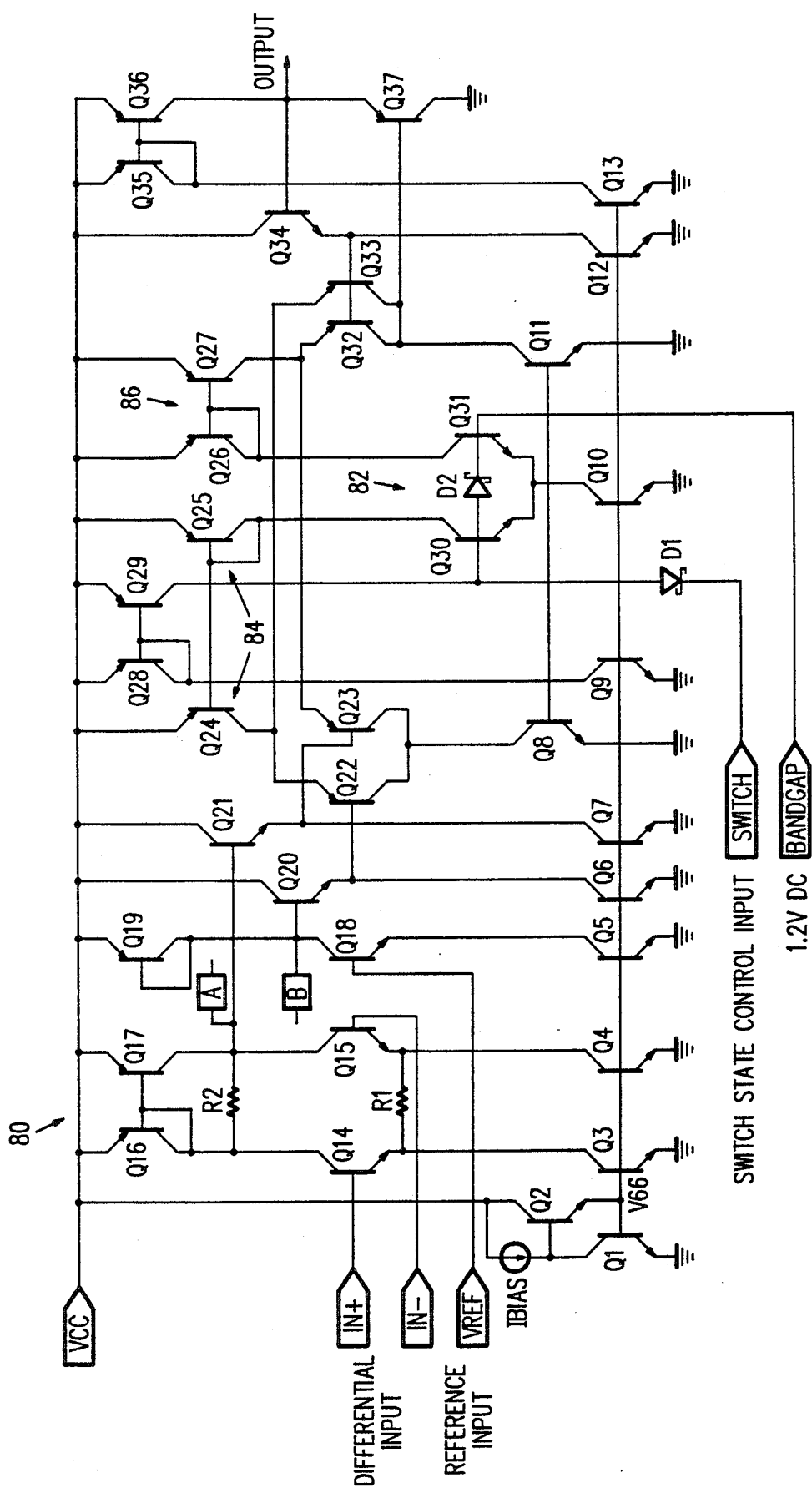
FIG. 2 is a schematic diagram of an AFC switch circuit according to the present invention.

Referring to FIG. 2, a schematic diagram of the AFC switch 72 is depicted. The differential detector input signals are coupled to terminals IN+ and IN−, shown at the left side of the figure. An output terminal is shown at the right side of the figure. A select input terminal is shown at the bottom of the figure.

In the synthesized mode of operation, the select input logic signal is high, and the reference voltage $V_{ref}$ appears at the output terminal. Conversely, in the AFC mode of operation, the select input logic signal is low, the difference between the differential detector input signal voltages appears as a voltage at the output terminal.

The circuitry of FIG. 2 includes the following sections. First, a differential amplifier 80 is provided for converting the differential detector input signals, input at terminals IN+ and IN−, to a single-ended AFC signal at node A. The amplifier 80 includes transistors Q3, Q4, Q14, Q15, Q16 and Q17. The AFC signal is related to the difference between the differential input signal voltages.

The reference voltage signal is input at the $V_{ref}$ terminal. The reference voltage is coupled to node B by level shift circuitry comprising transistors Q18 and Q19. The amplifier 80 and level shift circuitry are arranged such that the node A voltage varies symmetrically about the node B constant voltage.

Second, the AFC switch circuitry includes a current source comprising transistors Q28, Q29 and Q9. A constant current is provided from the collector of Q29. When the select input logic signal is low, the Q29 collector current is shunted through a diode D1 to the select input terminal. When the select input logic signal is high, diode D1 is reverse biased and the Q29 collector current is provided to enable circuitry described next.

The AFC switch circuit further includes enable circuitry 82 comprising transistors Q10, Q30 and Q31. Transistor Q10 provides a constant emitter current source. During operation of the switch circuit, one of transistors Q30 and Q31 is ON at any given time. The base of transistor Q31 is coupled to a band gap voltage source, nominally 1.2 volts. When select input logic signal is high, Q29 collector current drives Q30 on. The emitters of Q30, Q31, are pulled up to a voltage greater than the band gap voltage, so the base-emitter junction of Q31 is reverse biased, turning transistor Q31 off. Conversely, when the select input logic signal is low, and Q30 is deprived of base drive current, Q31 is turned on. A second diode D2 may be provided as shown in FIG. 2 to prevent saturation of transistor Q30.

The AFC switch circuitry further includes a pair of enable current mirrors. The first enable current mirror 84 is the reference voltage enable current mirror, comprising transistors Q24 and Q25. The other enable current mirror is the AFC enable current mirror 86, comprising transistors Q26 and Q27.

The reference enable current mirror is arranged such that, when Q30 is ON, the Q30 collector current is mirrored in the collector of Q24. Similarly, when transistor Q31 is on, the Q31 collector current is mirrored in the collector of Q27. The Q24 provides emitter current to turn on transistors Q22 and Q33. Similarly, transistor Q27 provides emitter current to turn on transistors Q23 and Q32. When transistors Q22, Q33 are turned on, the reference voltage at node B is coupled through transistors Q20, Q22, Q33, and Q8, Q11 and Q37 to the output. It may be observed that the reference voltage at node B is stepped down by a $V_{be}$ and back up by a $V_{be}$, twice, so that the output voltage equals the voltage at node B.

In the other case, i.e., when the select input logic signal is low, indicating AFC operation, the AFC voltage at node A is coupled through &transistors Q21, Q23, Q32 and Q8, Q11 and Q37 to the output terminal. Once again, the selected voltage is stepped down by a $V_{be}$ and back up by the same amount, twice, so that the desired voltage is presented at the output terminal. Transistors Q8 through Q11 provide active loads on the differential amplifier pairs described above. Other details of the AFC switch circuit, such as the base bias voltage $V_{bb}$ circuitry are known to those skilled in the pertinent art and therefore will not be described further.

Figure 3:
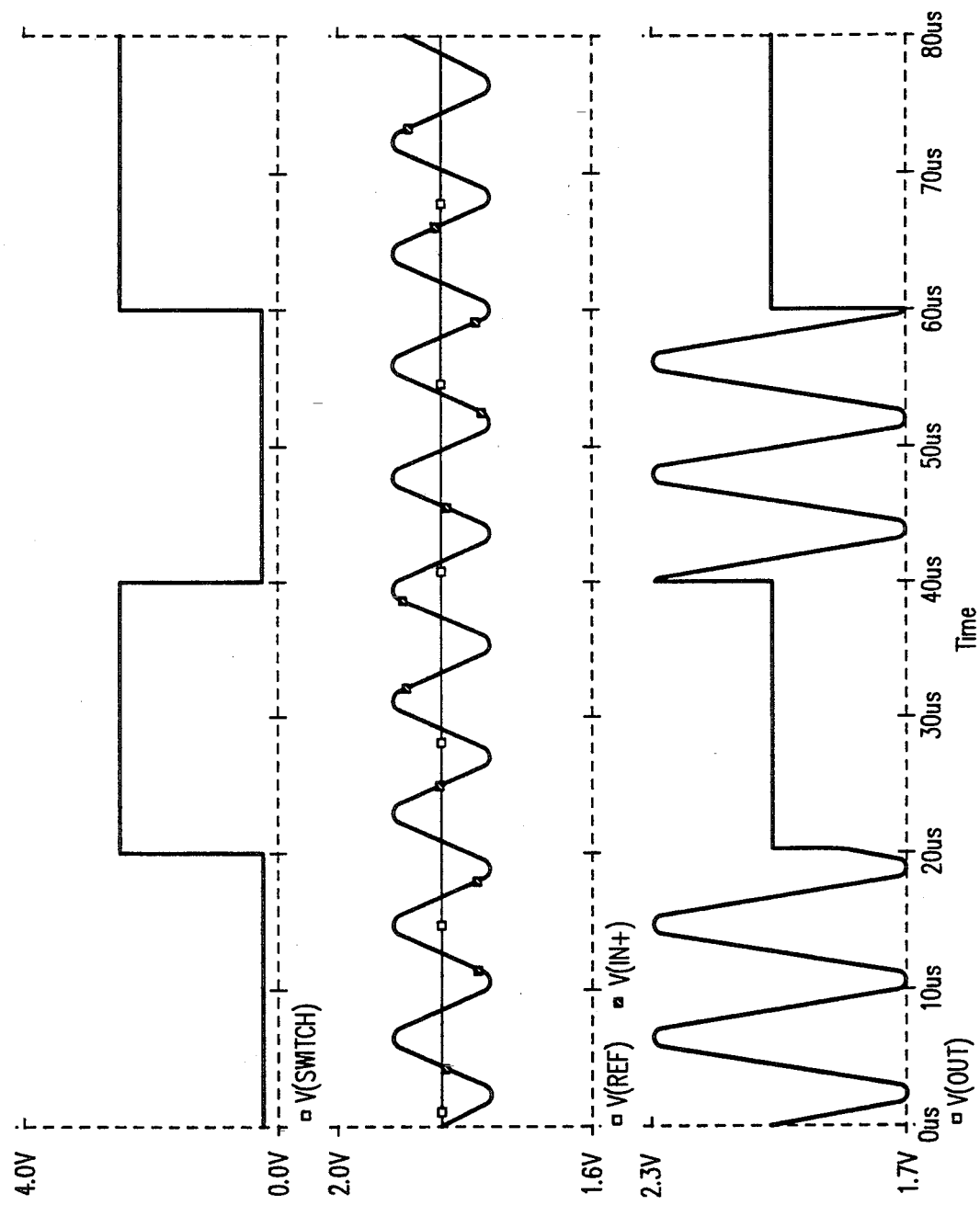
FIG. 3 is a simulation plot illustrating operation of the AFC switch of FIG. 2.

Operation of the AFC switch circuitry of FIG. 2 is illustrated in the simulation plot in FIG. 3. Referring to FIG. 3, the top waveform shows the select input logic signal voltage, labelled V(SWITCH). The intermediate waveforms include both the constant reference voltage V(REF) and the detector input signal voltage V(IN+). The lower waveform slows the switch output terminal voltage V(OUT). The horizontal axis represents time.

It may be observed that, when V(SWITCH) is low, indicating AFC mode of operation, the output voltage V(OUT) is related to V(IN+). Specifically, V(OUT) is equal to the voltage at node A. At time=20 usec, for example, the select input logic signal goes high, indicating synthesized operation. At that time, V(OUT) changes to the voltage at node B. Subsequent mode changes are shown at 20 usec intervals.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim

1. An integrated low voltage AFC switch circuit comprising:
    input means for receiving a differential detector input signal;
    amplifier means for converting the differential detector input signal to a single-ended AFC signal having a voltage responsive to the differential detector input signal voltage;
    a reference input terminal for receiving a reference signal having a predetermined voltage;
    a select input terminal for receiving a select input logic signal; and
    switch means responsive to such a select input logic signal for providing an output signal having a voltage equal to a selected one of the AFC signal voltage and the reference voltage, wherein the switch means includes:
    a voltage source;
    a select amplifier coupled to the select input terminal and responsive to said select input logic signal for providing a selected one of a predetermined AFC enable current and a predetermined reference enable current;
    an AFC current mirror coupled to the select amplifier to provide an AFC mirror current responsive to the AFC enable current;
    a reference current mirror coupled to the select amplifier to provide a reference mirror current responsive to the reference enable current;
    first means responsive to the AFC mirror current and coupled to the select amplifier for providing an output voltage equal to the AFC signal voltage; and
    second means responsive to the reference mirror current and coupled to said voltage source for providing an output voltage equal to the reference signal voltage.

2. An AFC switch circuit according to claim 1 wherein the select amplifier includes:
    first and second bipolar transistors each having an emitter terminal coupled to a common emitter current source;
    a base current source for said first transistor for providing a predetermined base current;
    a diode coupled between the base current source and the select input terminal or shunting the base current to the select input terminal when the select input logic signal is in a logical LOW state;
    the first transistor having a base terminal coupled to the base current source and arranged such that the base current drives the first transistor ON so long as the select input logic signal is in a logical HIGH state; and
    the second transistor having a base terminal coupled to a voltage source having a predetermined voltage so as to turn the second transistor OFF so long as the first transistor is ON and to turn the second transistor ON so long as the first transistor is OFF; the reference enable current being the collector current of one of the first and second transistors and the AFC enable current being the collector current of the other one of the first and second transistors when the circuit is in an operative condition.

3. An AFC switch circuit according to claim 2 including a second diode coupled between the base terminals of the first and second transistors to prevent saturation of the first transistor.

4. A method of switching a miniature FM receiver having a local oscillator and a detector among a synthesizer mode of operation and an AFC mode of operation, the method comprising:
    generating a differential input signal in the detector;
    converting the differential input signal to an AFC signal having a voltage related to the differential detector input signal voltages;
    providing a reference signal having a predetermined reference voltage;
    selecting one of the reference voltage and the AFC signal voltage; and
    providing an output signal having a voltage equal to the selected voltage to the local oscillator for controlling the local oscillator, wherein said selecting and providing an output signal further includes providing an AFC amplifier and a reference amplifier, each of said amplifiers having an input node and an output node;

coupling the reference signal to the reference amplifier input node;

coupling the AFC signal to the AFC amplifier input node;

selecting one of an AFC enable current corresponding to selecting the AFC signal and a reference enable current corresponding to selecting the reference signal;

mirroring the AFC enable current as an input stage bias current coupled to enable the AFC amplifier;

mirroring the reference enable current as an input stage bias current coupled to enable the reference amplifier;

coupling the outputs of the AFC amplifier and the reference amplifier to an output terminal; and coupling the output terminal back to the inverting input of the reference amplifier and to the inverting input of the AFC amplifier thereby providing unity gain operation so that the output terminal voltage equals the voltage corresponding to the selected enable current.

* * * * *